(12) United States Patent
Heiden

(10) Patent No.: US 7,903,259 B2
(45) Date of Patent: Mar. 8, 2011

(54) DEVICE FOR DETERMINING THE POSITION OF AT LEAST ONE STRUCTURE ON AN OBJECT, USE OF AN ILLUMINATION APPARATUS WITH THE DEVICE AND USE OF PROTECTIVE GAS WITH THE DEVICE

(75) Inventor: Michael Heiden, Wolfersheim (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 383 days.

(21) Appl. No.: 12/015,437

(22) Filed: Jan. 16, 2008

(65) Prior Publication Data

US 2008/0192264 A1 Aug. 14, 2008
US 2010/0110449 A2 May 6, 2010

Related U.S. Application Data

(60) Provisional application No. 60/889,595, filed on Feb. 13, 2007.

(30) Foreign Application Priority Data

Feb. 13, 2007 (DE) .......................... 10 2007 007 660
Oct. 11, 2007 (DE) .......................... 10 2007 049 133

(51) Int. Cl.
*G01B 11/02* (2006.01)
(52) U.S. Cl. ......................................................... 356/500
(58) Field of Classification Search .......... 356/399–401, 356/498, 501, 508, 509, 500
See application file for complete search history.

(56) References Cited

U.S. PATENT DOCUMENTS

| | | | | | |
|---|---|---|---|---|---|
| 4,831,272 | A | * | 5/1989 | Imai | 250/548 |
| 5,469,260 | A | * | 11/1995 | Takagi et al. | 356/500 |
| 5,550,633 | A | * | 8/1996 | Kamiya | 356/500 |

(Continued)

FOREIGN PATENT DOCUMENTS

DE 102004046375 A1 4/2006

OTHER PUBLICATIONS

Blasing, C., "Pattern Placement Metrology for Mask Making," SEMI, Mar. 31, 1998.

(Continued)

*Primary Examiner* — Patrick J Connolly
(74) *Attorney, Agent, or Firm* — Houston Eliseeva, LLP.

(57) ABSTRACT

A device for determining the position of a structure (3) on an object (2) in relation to a coordinate system is disclosed. The object (2) is placed on a measuring table (20) which is movable in one plane (25a), wherein a block (25) defines the plane (25a). At least one optical arrangement (40, 50) is provided for transmitted light illumination and/or reflected light illumination. The optical arrangement (40, 50) comprises an illumination apparatus (41, 51) for reflected light illumination and/or transmitted light illumination and at least one first or second optical element (9a, 9b), wherein at least part of the at least one optical element (9a, 9b) extends into the space (110) between the block (25) and an optical system support (100). The block (25) and/or the optical system support (100) separates the illumination apparatus (41, 51) spatially from the plane (25a) in which the measuring table (20) is movable.

22 Claims, 10 Drawing Sheets

U.S. PATENT DOCUMENTS

| | | | |
|---|---|---|---|
| 5,552,888 A * | 9/1996 | Sogard et al. | 356/500 |
| 5,708,505 A * | 1/1998 | Sogard et al. | 356/500 |
| 5,956,142 A * | 9/1999 | Muller et al. | 356/504 |
| 6,323,953 B1 * | 11/2001 | Blaesing-Bangert et al. | 356/614 |
| 6,347,458 B1 | 2/2002 | Kaczynski | |
| 6,377,870 B1 | 4/2002 | Blaesing-Bangert et al. | |
| 6,438,856 B1 | 8/2002 | Kaczynski | |
| 6,542,251 B2 * | 4/2003 | Mueller-Rentz | 356/614 |
| 6,559,458 B2 * | 5/2003 | Rinn | 250/491.1 |
| 6,597,002 B1 | 7/2003 | Kondo | |
| 6,741,358 B1 * | 5/2004 | Kamiya | 356/500 |
| 6,920,249 B2 | 7/2005 | Rinn et al. | |
| 6,960,755 B2 | 11/2005 | Kaczynski | |
| 6,975,409 B2 * | 12/2005 | Cemic et al. | 356/620 |
| 6,992,780 B2 * | 1/2006 | Sentoku et al. | 356/620 |
| 7,209,243 B2 | 4/2007 | Cemic et al. | |
| 7,265,823 B2 | 9/2007 | Kreh et al. | |
| 7,385,671 B2 * | 6/2008 | Gardner et al. | 355/53 |
| 7,450,246 B2 * | 11/2008 | Boesser et al. | 356/500 |
| 7,548,321 B2 * | 6/2009 | Rinn | 356/500 |
| 7,694,426 B2 * | 4/2010 | Heiden et al. | 33/503 |
| 2001/0008272 A1 * | 7/2001 | Rinn | 250/491.1 |
| 2001/0028456 A1 * | 10/2001 | Nishi | 356/400 |
| 2001/0046053 A1 * | 11/2001 | Hill | 356/496 |
| 2002/0057424 A1 * | 5/2002 | Shima | 355/53 |
| 2003/0117600 A1 | 6/2003 | Taniuchi et al. | |
| 2004/0227918 A1 * | 11/2004 | Kurosawa | 355/55 |
| 2005/0254068 A1 * | 11/2005 | Rinn et al. | 356/625 |
| 2006/0126069 A1 * | 6/2006 | Cho et al. | 356/399 |
| 2006/0203252 A1 * | 9/2006 | Ishizuka | 356/500 |
| 2007/0103667 A1 * | 5/2007 | Ferber et al. | 355/72 |
| 2007/0103696 A1 * | 5/2007 | Pohlmann | 356/498 |
| 2007/0234829 A1 * | 10/2007 | Pirsch et al. | 73/865.6 |
| 2007/0268495 A1 * | 11/2007 | Rinn | 356/500 |
| 2007/0268496 A1 * | 11/2007 | Boesser et al. | 356/508 |
| 2008/0192264 A1 * | 8/2008 | Heiden | 356/615 |
| 2008/0204735 A1 * | 8/2008 | Heiden | 356/237.4 |
| 2008/0295348 A1 * | 12/2008 | Heiden et al. | 33/502 |
| 2008/0304058 A1 * | 12/2008 | Heiden | 356/237.5 |
| 2009/0015833 A1 * | 1/2009 | Heiden et al. | 356/364 |
| 2009/0024344 A1 * | 1/2009 | Heiden et al. | 702/95 |
| 2009/0031572 A1 * | 2/2009 | Boesser et al. | 33/503 |
| 2009/0033508 A1 * | 2/2009 | Boesser et al. | 340/626 |
| 2009/0040530 A1 * | 2/2009 | Heiden | 356/500 |
| 2009/0045318 A1 * | 2/2009 | Heiden et al. | 250/205 |
| 2009/0051932 A1 * | 2/2009 | Heiden et al. | 356/614 |
| 2009/0066955 A1 * | 3/2009 | Boesser et al. | 356/388 |
| 2009/0066970 A1 * | 3/2009 | Scheuring et al. | 356/625 |
| 2009/0070059 A1 * | 3/2009 | Heiden et al. | 702/95 |
| 2009/0073458 A1 * | 3/2009 | Heiden et al. | 356/500 |
| 2009/0097041 A1 * | 4/2009 | Heiden | 356/616 |
| 2009/0128828 A1 * | 5/2009 | Pietsch et al. | 356/498 |
| 2010/0110449 A2 * | 5/2010 | Heiden | 356/615 |

OTHER PUBLICATIONS

Jaeger, G. et al., "Nanomeasuring and nanopositioning engineering," Proc. of SPIE vol. 6280, 628001, (2006).

Broadbent, W. H., "Results from a new die-to-database reticle inspection platform," Proc. of SPIE vol. 5446 (2004), pp. 265-278.

* cited by examiner

Prior Art  Fig. 1

DEVICE FOR DETERMINING THE POSITION OF AT LEAST ONE STRUCTURE ON AN OBJECT, USE OF AN ILLUMINATION APPARATUS WITH THE DEVICE AND USE OF PROTECTIVE GAS WITH THE DEVICE

RELATED APPLICATIONS

This application claims priority to German Patent Application No. 10 2007 007 660.8 filed on Feb. 13, 2007, and German Patent Application No. 10 2007 049 133.8, filed on Oct. 11, 2007, and claims the benefit under 35 USC 119(e) of U.S. Provisional Application No. 60/889,595, filed on Feb. 13, 2007, all of which are incorporated herein by reference in their entirety.

BACKGROUND OF THE INVENTION

The present invention relates to a device for determining the position of a structure on an object. In particular, the invention relates to a device for determining the position of a structure on an object in relation to a coordinate system. The object is placed on a measuring table which is movable in one plane, wherein a block defines a plane in which the measuring table is movable. At least one laser interferometer for determining a positional displacement of the measuring table in the plane is further provided. At least one optical arrangement is provided for transmitted light illumination and/or reflected light illumination.

The invention further relates to the use of at least one illumination apparatus with a device for determining the position of at least one structure on an object.

The invention further relates to the use of protective gas with a device for determining the position of at least one structure on an object.

A measuring device for measuring structures on masks or substrates used for the production of semiconductors is known from the lecture manuscript "Pattern Placement Metrology for Mask Making" by Dr. Carola Bläsing. The lecture was given on the occasion of the Semicon Education Program congress in Geneva on 31 Mar. 1998. This lecture manuscript discloses the basis of a device for determining the positions of structures on a substrate. With regard to the details of the operation and the structure of a device of this type, reference should be made to FIG. 1 of this patent application, which illustrates the prior art.

In measuring equipment and devices of the prior art, optical sensing methods are still favored, although the measuring accuracy required (currently in the region of a few nanometers) lies far beneath the resolution achievable with the light wavelength used (the spectral region of the near UV). The advantage over devices that operate using optical measuring methods lies essentially in a less complex design and easier operation compared with systems using other sensing systems, for example, with X-rays or electron beams.

A measuring device for measuring structures on a transparent substrate is also disclosed by the published application DE 198 19 492. The measuring device comprises a reflected light illumination apparatus, an imaging device and a detector device for imaging the structures on the substrate. The substrate is placed on a displaceable measuring table which can be displaced perpendicularly to the optical axis. The position of the measuring table is determined by interferometric means. The detector apparatus registers the edge profiles created by the structures. Based on the profiles, the position of the edges of the respective structure can be deter-mined in relation to a fixed coordinate system.

A device of this type is disclosed, for example, in DE 199 49 005, DE 198 58 428, DE 101 06 699 and DE 10 2004 023 739. In all these prior art documents, a coordinate measuring machine is described with which structures on a substrate can be measured. The substrate is placed on a measuring table which can be moved in the X-coordinate direction and in the Y-coordinate direction. Suitable light sources are used for illuminating the substrate. The substrate can be illuminated either by transmitted light and/or by reflected light. For imaging the illuminated structures, a measuring objective which is also arranged in the reflected light ray path is provided. The light collected by the objective lens is directed to a detector which, in conjunction with a computer, converts the received signals into digital values.

The structures on wafers or the masks used for exposure permit only extremely small tolerances. In order to check these structures, a very high degree of measuring accuracy (currently in the nanometer range) is needed. A method and a measuring device for determining the positions of these structures are disclosed in the German specification laid open to inspection DE 100 47 211 A1. For details of the positional determination described, reference is therefore expressly made to this document.

Previously, devices for measuring masks or structures on masks have used mercury-xenon lamps for illuminating the measuring optical system. These have a very marked intensity maximum in their spectrum at 365 nm. This wavelength or the region round this wavelength is used for illuminating the measuring optical system. The energy in this line has previously been sufficient for illuminating the measuring optical system. In future systems, due to the increased demands placed on the resolving power, it will be necessary to change over to ever shorter wavelengths (248 nm, 193 nm, 157 nm). This higher resolution will be demanded by customers since the structures on the masks are becoming ever smaller. However, at these wavelengths, the lamps typically used for illumination in microscopes do not produce any spectral lines of sufficient intensity. It is therefore necessary to make use of alternative light sources or alternative configurations of the device for measuring structures on a substrate. The necessary spectral lines are not present at sufficient intensity in the wavelength range required here.

SUMMARY OF THE INVENTION

It is therefore an object of the present invention to provide a device with which it is possible to carry out examination of masks and substrates with smaller structures. In addition, the range within which the object to be measured is moved must not be influenced by heat production from possibly suitable illumination apparatus.

This object is solved with a device for determining the position of a structure on an object in relation to a coordinate system, the device comprises a measuring table carrying the object, wherein the measuring table is movable in a plane, a block defines the plane, wherein at least one laser interferometer system is used for determining a positional change of the measuring table in the plane, at least one optical arrangement is provided for transmitted light illumination and/or reflected light illumination of the object, an illumination apparatus for reflected light illumination and/or transmitted light illumination and at least one optical element are provided, wherein at least one part of the at least one optical element extends into a space formed between the block and an optical system support, wherein the block and/or the optical system support spatially separates the illumination apparatus from the plane in which the measuring table is movable.

It is a further object of the invention to design an illumination apparatus for use with a device for determining the position of at least one structure on an object such that the device can be used to measure objects with smaller structure separations.

The above object is solved by use of at least one illumination apparatus in a device for determining the position of at least one structure on an object, wherein the at least one illumination apparatus is provided in the reflected light illumination apparatus and/or the transmitted light illumination apparatus, and that the illumination apparatus provides light for a first optical element and/or light for a second optical element and that at least one system for triggering the illumination light is assigned to the illumination apparatus.

It is a further object of the invention to design a device for measuring structures on objects such that the service life of the optical components is extended.

The above object is solved the use of protective gas in a device for determining the position of at least one structure on an object, wherein at least one optical component in the path of the light from at least one illumination apparatus to at least one optical element is surrounded by protective gas.

When determining the position of a structure on an object in relation to a coordinate system, it is advantageous if the object is placed on a measuring table that is movable in one plane. A block is provided which defines the plane in which the table can be moved. Furthermore, at least one laser interferometer for determining the positional displacement of the measuring table in the plane is provided. At least one optical arrangement is provided for transmitted light illumination and/or reflected light illumination. The optical arrangement also comprises an illumination apparatus for reflected light illumination and/or transmitted light illumination of at least one optical element. At least one part of the at least one optical element is provided in the space formed between the block and the optical system support. The block and/or the optical system support separates the illumination apparatus from the plane in which the measuring table is movable.

The illumination apparatus comprises as the light source at least one excimer laser or at least one frequency multiplied solid-state laser or gas laser or at least one excimer lamp. The at least one optical element which represents an objective lens is designed as a high-resolution microscope objective which forms an image of the structure on the surface of the object under reflected light and/or transmitted light in the spectral range of the near UV on at least one detector.

There are several advantageous embodiments of the device with which the invention can be realized. For example, the illumination apparatus is mounted only in the reflected light arrangement and the first optical element is mounted opposing the object in the reflected light arrangement. In this embodiment, the first optical element is an objective lens. A further possibility is that the illumination apparatus is only mounted in the transmitted light arrangement. The second optical element is then mounted under the object in the transmitted light arrangement. The second optical element is a condenser. This arrangement can also be regarded as a reflected light arrangement if the object is placed in the measuring table such that the structures present on the surface of the object face in the direction of the second optical element. In this orientation of the object, the second optical element is also an objective lens (microscope objective). This arrangement has the advantage that the objects, masks or substrates are placed in the same orientation in the device as the masks, objects or substrates are placed when used in a stepper for the production of the semiconductors.

In a further advantageous embodiment of the device, the illumination apparatus makes light available for reflected light illumination and for transmitted light illumination. The first optical element is mounted as an objective lens opposite the object in the reflected light arrangement and the second optical element in the form of a condenser is mounted under the object in the transmitted light arrangement. It is also conceivable for separate light sources to be provided for reflected light illumination and transmitted light illumination.

For the light source of the illumination apparatus, it is advantageous to use an excimer laser at a wavelength of 157 nm or 248 nm. A frequency-multiplied solid-state laser or gas laser with a wavelength of 266 nm, 213 nm or 193 nm can also be used as the light source for the illumination apparatus. An excimer lamp for the typical excimer laser lines can also be used.

The optical arrangement used with the device for measuring structures on a substrate can comprise in the illumination branch for reflected light illumination and/or transmitted light illumination, respectively, at least one apparatus for speckle reduction and/or at least one shutter and/or at least one homogenizer and/or at least one beam attenuator.

A possible arrangement of the various components of the optical arrangement in the first illumination branch is that the illumination apparatus has a beam attenuator connected downstream of it. Following the beam attenuator are the shutter, the apparatus for speckle reduction and the homogenizer. Once the light beam leaves the homogenizer, it reaches the first optical element. Furthermore, the illumination apparatus can also have a beam monitor assigned to it. With the beam monitor, the intensity of the light emerging from the illumination apparatus or the light source can be checked. Depending on the result of the checking, adjustment of the intensity of the illumination apparatus can be carried out so that, finally, the same intensity al-ways falls on the object to be measured.

A deflecting mirror which directs the light from the illumination apparatus in the first illumination branch through the optical system support to the first optical element is provided. This is only the case if the light from the illumination apparatus runs parallel to, and over, the optical system support. If the illumination apparatus with the beam attenuator, the shutter, the apparatus for speckle reduction and/or the homogenizer is mounted under the block, that is, in the second illumination branch, then again a deflecting mirror which directs the light from the illumination apparatus through the block to the second optical element is also provided.

The illumination apparatus can also be arranged laterally on the device. Given a lateral arrangement of the illumination apparatus, the beam attenuator and the beam monitor can also be assigned to the illumination apparatus. This lateral arrangement is advantageous because, for cooling the illumination apparatus, an air stream can be directed unhindered towards the illumination apparatus and the additional components which generate a substantial amount of heat. The object is to conduct away the dissipation heat in order that the heat generated does not influence the device and finally also the measuring results obtained with the device.

In an advantageous embodiment of the invention, one illumination apparatus is provided. The light emerging from the illumination apparatus is led or guided by suitable deflecting means or by dividers which divide the beam emerging from the illumination apparatus into the first illumination branch, which runs substantially parallel to the optical system support, and into the second illumination branch, which is provided under the block. In order to enable passage of the beam through the block, suitable perforations are provided in the block. For the event that the illumination branch runs parallel to, and over, the optical system support, a suitable recess is provided in the optical system support, which enables the passage of the illumination light.

The shutter used with the device can be configured as an obstructer or as a pivoting mirror or as a movable divider or mirror. A beam attenuator can be provided in the first or second illumination branch. The beam attenuator consists of a filter wheel on which plates having different transmittance values are arranged. According to need, the relevant plate can be moved by the filter wheel into the beam path of the first or second illumination branch. Furthermore, the plates can have different reflection values. A further possible embodiment of the variable beam attenuator is that the angle of incidence of the light from the at least one illumination source onto an inclined and coated substrate is varied. The attenuated light from the light source that is transmitted through the coated substrate can be further used in the device. The inclined and coated substrate causes a beam offset. This beam offset can be compensated for by a further inclined substrate. The angular position of the individual substrates can be varied with motors.

The illumination apparatus for the reflected light or transmitted light illumination has a homogenizer for the field illumination and/or a homogenizer for the pupil illumination of the first optical element and/or the second optical element.

The homogenizer can have different configurations. It can comprise a plurality of microlenses. It can also be configured as a hexagonal array of microlenses. An orthogonal array of microlenses is also conceivable. The microlenses can also be configured as a cylindrical lens array, wherein two crossed cylindrical lens arrays are provided. The microlenses can also have an aspherical surface. A further embodiment of the homogenizer is that a diffractive element is provided. The homogenizer can also consist of a light mixing rod.

An apparatus for speckle reduction can be provided in the first illumination branch and/or in the second illumination branch. The speckle reduction apparatus can be diffractive in design. The apparatus for speckle reduction can also be configured as a diffusion screen. A further design possibility for the apparatus for speckle reduction is a mode mixing fiber.

The illumination apparatus is fastened to the device with a material of low thermal conductivity in order to reduce the heat conduction to the optical system support and/or to the block. In order to be able to transport away the dissipation heat effectively, cooling ribs are also provided. As already mentioned, an air stream is directed towards the illumination apparatus in order to increase the effectiveness of the removal of dissipation heat.

Advantageously, a climate chamber is provided, wherein the at least one illumination apparatus is arranged outside the climate chamber. By this means, the influence of the dissipation heat generated by the illumination apparatus on the remaining components of the device is substantially reduced. The climate chamber can be filled, for example, with a protective gas. Nitrogen has proved useful as a possible protective gas. The light from the illumination apparatus passes via windows into the interior of the climate chamber.

A further advantageous embodiment of the invention is the use of at least one illumination apparatus in a device for determining the position of at least one structure on an object. The at least one illumination apparatus may be provided in the reflected light illumination apparatus and/or the transmitted light illumination apparatus. The illumination apparatus provides light for a first optical element and/or light for a second optical element. The illumination apparatus has at least one shutter assigned to it. As already mentioned, the illumination apparatus is provided with a light source which comprises at least one excimer laser or at least one frequency multiplied solid-state or gas laser or at least one excimer lamp as the illumination source.

A further advantage of the invention is the use of protective gas in a device for determining the position of at least one structure on an object. At least one optical component in the path of the light from at least one illumination apparatus to at least one optical element is surrounded by protective gas.

It is particularly advantageous if all the optical components in the path of the light from the at least one illumination apparatus to the optical elements are surrounded by protective gas. For this purpose, the optical components are surrounded by an encapsulation and the light from the at least one illumination apparatus passes within the encapsulation. The protective gas in the encapsulation is nitrogen, since it is particularly readily and economically available.

Further advantageous embodiments and uses of the invention are contained in the subclaims.

BRIEF DESCRIPTION OF THE DRAWINGS

The exemplary embodiments of the invention and their advantages will now be described in greater detail by reference to the accompanying drawings, in which.

DETAILED DESCRIPTION OF THE PREFERRED EMBODIMENTS

Figure 1:
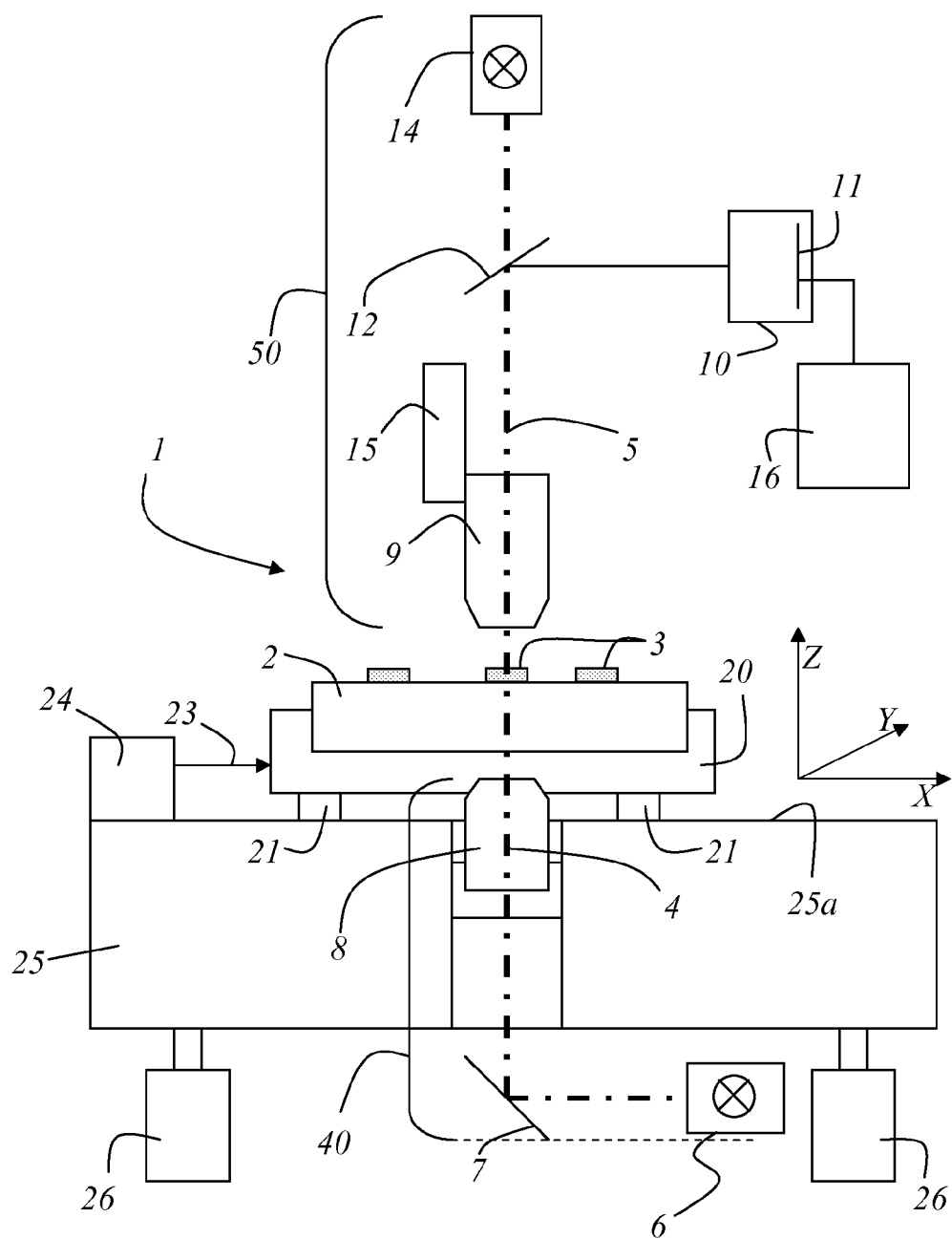
FIG. 1 shows in schematic form a device for measuring structures on a substrate, as has long been known from the prior art.

FIG. 1 shows a schematic representation of a coordinate measuring machine as has long been known from the prior art. The coordinate measuring machine is identified in the further description as a device. It should also be noted that in the description below and in the drawings, the same elements are identified with the same reference signs.

A device is used, for example, for determining the width (CD—critical dimension) of a structure on a substrate 2. Also, using the device, the position of a structure 3 on the substrate can be determined. Although the device shown in FIG. 1 has long been known from the prior art, for the sake of completeness, the operation of the device and the arrangement of the individual elements of the device will be discussed.

The device 1 comprises a measuring table 20, which is arranged displaceable on air bearings 21 in a plane 25a, in the X-coordinate direction and in the Y-coordinate direction. For the mounting of the measuring table 20, bearings other than air bearings can also be used. The plane 25a is formed from one element 25. In a preferred embodiment, the element 25 is granite. However, to a person skilled in the art, it is obvious that the element 25 can be made from another material, which provides a precise plane for the displacement of the measuring table 20. The position of the measuring table is measured by means of at least one laser interferometer 24 which, for the measurement, emits a light beam 23 which hits the measuring table 20. The element 25 itself is mounted on oscillation dampers 26 in order to prevent building oscillations reaching the device.

Placed on the measuring table 20 is a substrate 2, which bears the structures to be measured 3. The substrate 2 can be illuminated with a transmitted light illumination apparatus 6 and/or a reflected light illumination apparatus 14. The transmitted light illumination apparatus 6 is provided in an optical arrangement 40. The reflected light illumination apparatus 14 is also provided in an optical arrangement 50. The optical arrangement 50 comprises the transmitted light illumination apparatus, a deflecting mirror and a condenser. By means of the deflecting mirror, the light from the transmitted light illumination apparatus 6 is directed onto the condenser. The further optical arrangement 50 comprises the reflected light illumination apparatus 14, a beam-splitting mirror 12, the measuring objective 9 and a displacing device 15 assigned to the measuring objective 9. Using the displacing device 15, the measuring objective 9 can be displaced in the Z-coordinate direction (e.g. for focusing). The measuring objective 9 collects light coming from the substrate 2 and deflects it out of the reflected light illumination axis 5 by means of the partially transparent deflecting mirror 12. The light passes to a camera 10 which is provided with a detector 11. The detector 11 is linked to a computer system 16 which generates digital images from the measurement values determined by the detector 11.

Figure 2:
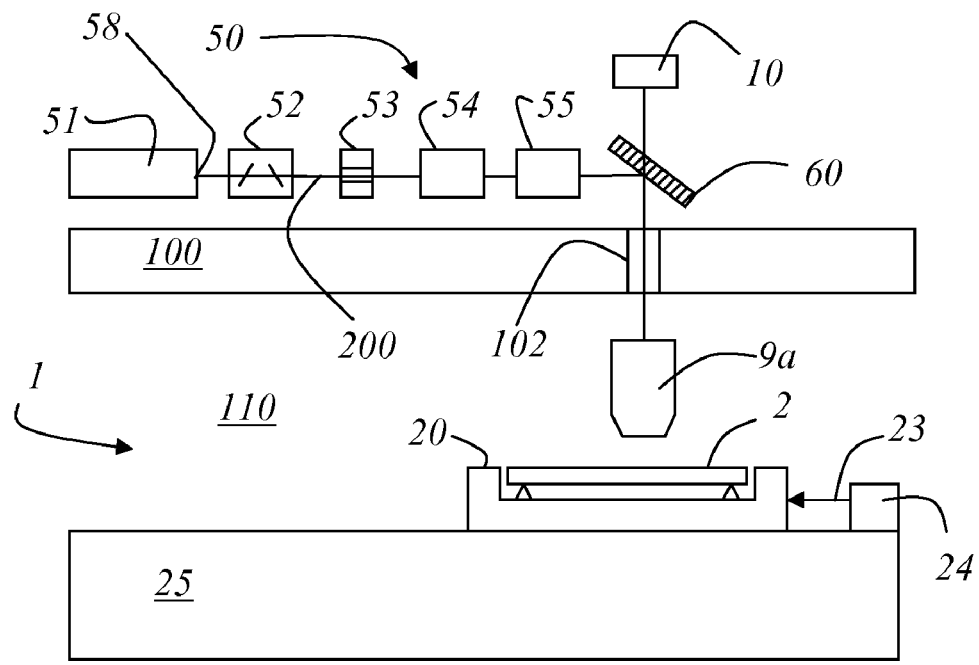
FIG. 2 shows an embodiment of the device, wherein the optical device is arranged together with the illumination apparatus over an optical system support.

FIG. 2 shows an embodiment of the device 1 according to the invention. An optical arrangement 50 is arranged above an optical system support 100. The optical arrangement 50 comprises at least one illumination apparatus 51. In addition to the optical system support 100, a block 25 is provided. The block 25 and the optical system support 100 are arranged such that they form an intermediate space 110. Provided in the intermediate space is a first optical element 9a (objective lens). This first optical element 9a is arranged opposing a measuring table 20 which is arranged movable on the block 25 in a plane 25a. The position of the measuring table 20 is measured with at least one interferometer 24 which directs a laser beam 23 towards the measuring table. Provided on the measuring table 20 is an object 2, in which the structures present on the object 2 can be measured with the first optical element 9a. The first optical element 9a is arranged in a reflected light illumination apparatus in relation to the object 2. The light from the illumination apparatus 51 passes via a deflecting mirror 60 to the first optical element 9a. In the embodiment shown in FIG. 2, the light beam from the illumination apparatus runs parallel to, and over, the optical system support 100. It is also conceivable, however, that the light beam from the illumination apparatus runs parallel to, and under, the optical system support 100. In the embodiment shown in FIG. 2, the optical system support 100 is provided with a recess 102 in order that the light from the illumination apparatus 51 can pass unhindered to the first optical element 9a. A camera 10 is provided for recording the images formed by the first optical element 9a of the structures 3 on the object 2. Furthermore, between the illumination apparatus 51 and the deflecting mirror 60, the optical arrangement 50 also has a beam attenuator 52, a shutter 53, an apparatus for speckle reduction 54 and/or a homogenizer 55. In a particularly preferred embodiment, the illumination apparatus 51 is configured as an excimer laser. The illumination apparatus 51 has, for this purpose, a first outlet 57 via which the light generated by the illumination apparatus 51 passes to the first illumination branch 200. Apart from the embodiment of the illumination apparatus 51 in the form of an excimer laser, further promising alternatives for the design of the illumination apparatus 51 are conceivable. One possibility for the design of the illumination apparatus are so-called excimer lamps which emit light in the same wavelengths as excimer lasers. Furthermore, frequency-multiplied solid-phase lasers and gas lasers can be used. Where, in the following, illumination apparatus and light sources are mentioned, the three possible types of light source that can be used in the present invention with an expectation of success are always meant.

Figure 3:
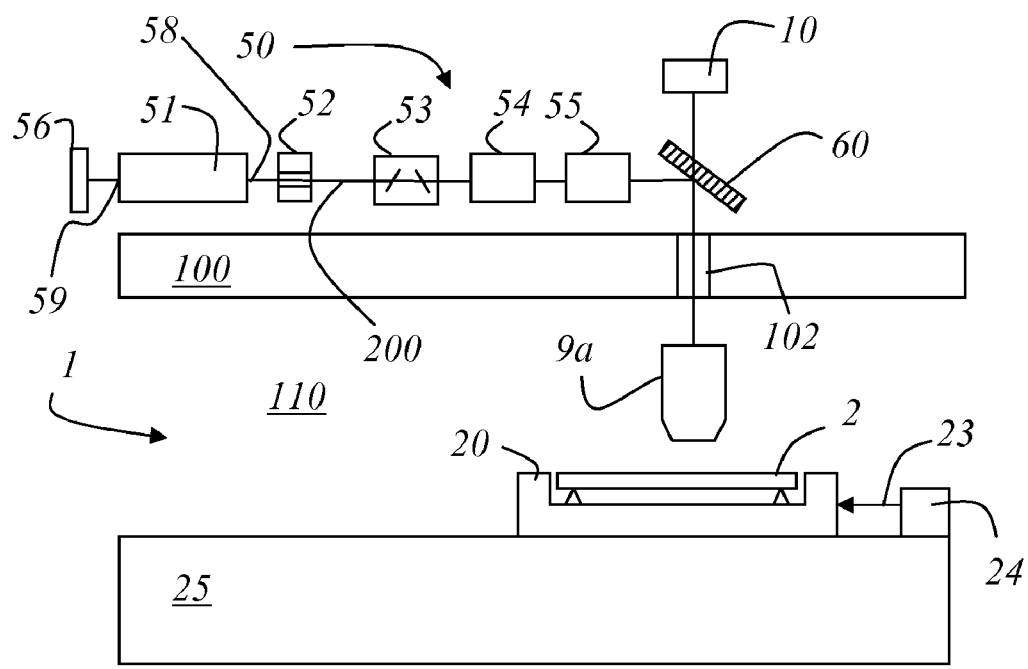
FIG. 3 shows a further configuration of the embodiment of FIG. 2, wherein the illumination apparatus also has a beam monitor assigned to it.

FIG. 3 shows another embodiment of the optical elements, which are arranged in the first optical arrangement 50 over the optical system support 100. The construction of the device 1 shown in FIG. 3 is identical to the construction of the device as per FIG. 2, except for the beam monitor 56. The illumination apparatus 51 has a first outlet 58 and a second outlet 59. Assigned to the second outlet 59 is a beam monitor 56 with which the quality of the light emitted by the illumination apparatus 51 can be monitored. It is thus possible with the beam monitor 56 to determine intensity variations of the illumination apparatus and to initiate a corresponding correction so that a constant intensity always falls on the substrate 2.

Figure 4:
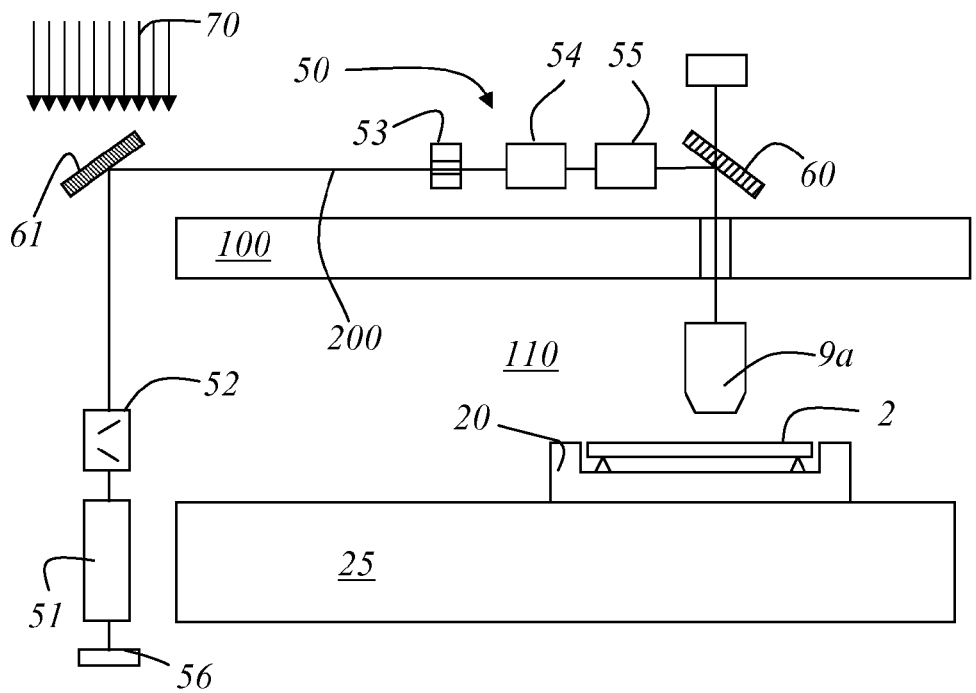
FIG. 4 shows an embodiment of the device, wherein the illumination apparatus is arranged laterally on the device and wherein an air stream is directed onto the illumination apparatus.

FIG. 4 shows an embodiment of the device 1 which is also essentially identical to the configuration of the device according to FIG. 3. In the following, not all the reference signs relating to the elements shown in the drawings will be included so as to ensure the clarity of the drawings and the associated description. In FIG. 4, the illumination device 51 together with the beam attenuator 52 and the beam monitor 56 are mounted laterally on the device 1. In the case illustrated here, the illumination apparatus 51 is provided laterally on the block 25. The arrangement of the device laterally on the block 25 is only one of several possible embodiments of the invention. The light emitted from the illumination apparatus 51 passes via the beam attenuator 52 to a second deflecting mirror 61. The deflecting mirror 61 is arranged such that it directs the light into the first illumination branch 200 of the first optical arrangement 50. The light is thereby deflected round the optical system support 100 and only then passes, by way of the first deflecting mirror 60, through the optical system support 100 to the first optical element 9a. Due to the heat generated by the illumination apparatus 51, it is useful to arrange it as far as possible from the substrate 2 to be measured. A particularly favourable arrangement is shown in FIG. 4. An air stream 70 can be directed towards the illumination apparatus 51 which is arranged laterally on the block 25, by which means the dissipation heat from the illumination apparatus 51 can be removed particularly effectively.

Figure 5:
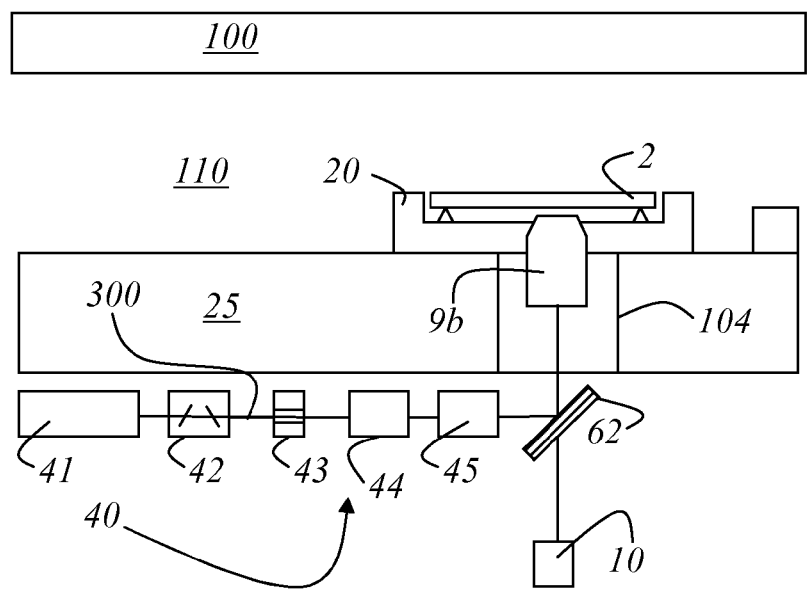
FIG. 5 shows an embodiment of the invention, wherein the second illumination branch is arranged under the block and wherein the light from the illumination apparatus is directed onto the second optical element.

FIG. 5 shows a further possible arrangement of the illumination apparatus 41 in the device 1 according to the invention. The illumination apparatus 41 is provided in the second optical arrangement 40. The optical arrangement 40 is provided beneath the block 25 of the device 1. The light emitted from the illumination apparatus 41 reaches a deflecting mirror 62 and is thereby deflected to a second optical element 9b (which functions here as an objective lens), which partially reaches into the space 110 between the block 25 and the optical system support 100. The second optical element 9a is arranged such that it is provided opposite a substrate 2 which is laid on a measuring table 25. Furthermore, the second optical arrangement 40 can comprise a beam attenuator 42, a shutter 43, an apparatus for speckle reduction 44 and/or a homogenizer 45. The deflecting mirror 62 can also be constructed half-silvered so that the light coming from the substrate and captured by the second optical element 9a passes to a camera 10.

Figure 9A:
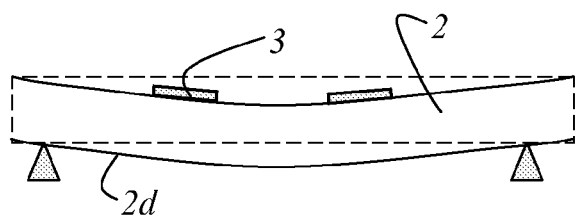
FIG. 9a shows a substrate, which is placed on the table such that the structures face in the direction towards the first optical element.
Figure 9B:
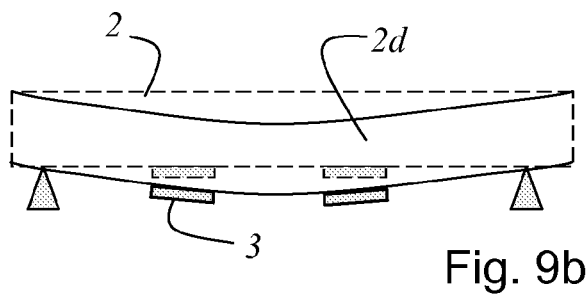
FIG. 9b shows the substrate, which is placed on the table such that the structures on the substrate face in the direction of the second optical element.

Depending on the orientation of the substrate on the measuring table 20, the embodiment of the invention shown in FIG. 1 or FIG. 5 can be used both in the transmitted light arrangement and in the reflected light arrangement. The orientation of the substrate is intended to denote whether the structures 3 present on the substrate 2 face in the direction of the first or the second optical element 9a or 9b used for the investigation, or whether the structures 3 present on the substrate face away from the first or second optical element 9a or 9b used for the investigation. FIG. 9a shows the substrate 2 in the conventional orientation which means that the structures 3 on the surface of the substrate 2 face in the direction of the first or second optical element 9a or 9b used for the investigation. If the substrate 2 is inserted in the measuring table 20 with this orientation, then the arrangement in FIG. 1 is said to be a reflected light illumination arrangement. FIG. 9b shows the orientation of the substrate 2 in the measuring table 20 wherein the structures 3 on the substrate 2 face away from the first optical element 9a (in FIG. 1) used for the investigation. In contrast thereto, however, the structures 3 on the substrate 2 face toward the second optical element 9b in FIG. 5. If the substrate 2 is inserted in the measuring table 20 with the orientation shown in FIG. 9b, the proposed arrangement of the first optical element 9a as shown in FIG. 1 is said to be a transmitted light illumination arrangement. With the arrangement of the second optical element 9b as per FIG. 5, on the other hand, with the orientation of the substrate as proposed in FIG. 9b, it is said to be a reflected light illumination arrangement. In addition, the arrangement of the substrate 2 shown in FIGS. 9a and 9b show that the substrate 2 experiences bending due to the support points on the measuring table 20. The bending of the substrate 2 is represented in FIGS. 9a and 9b by solid lines and the bend substrate is identified with the reference sign 2d. The device as proposed in FIG. 5 is particularly advantageous if the substrate with the orientation proposed in FIG. 9b is inserted into the measuring table 20 with the arrangement proposed in FIG. 5. The arrangement proposed in FIG. 5 is thus used in the reflected light arrangement. Therefore, with the arrangement proposed in FIG. 5, the substrates can be measured with the same orientation as they have in a stepper. Added to this is the fact that with the apparatus as proposed in FIG. 5, the substrates are measured with the same wavelength as used in a stepper if the masks are illuminated on the wafer through the stepper.

Figure 6:
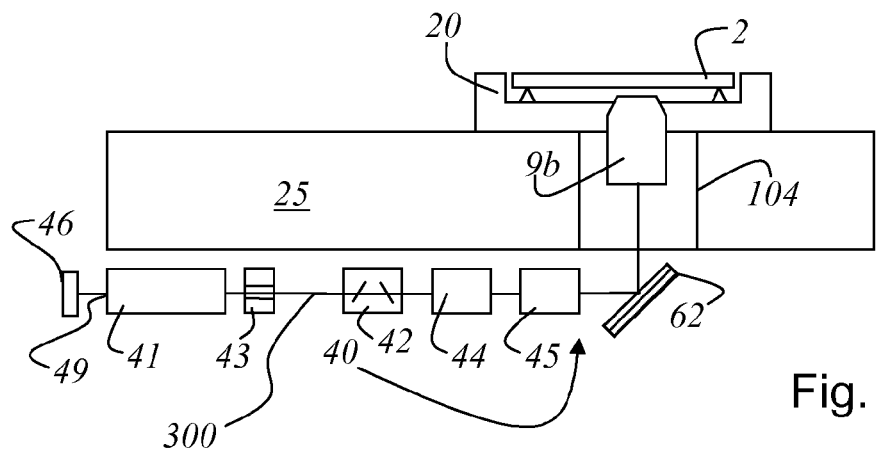
FIG. 6 shows an embodiment of the invention, wherein the illumination apparatus also has a beam monitor assigned to it.

FIG. 6 shows a further embodiment of the device as per FIG. 5, with the difference that the illumination apparatus 41 also has a beam monitor 46 assigned to it. The beam monitor 46 is assigned to the second outlet 49 of the illumination apparatus 41. Thus the luminous power output by the illumination apparatus 41 can be monitored by the beam monitor 46. Depending on the measuring result from the beam monitor 46, the illumination apparatus 41 can be adjusted accordingly so that the same intensity always falls on the object 2.

Figure 7:
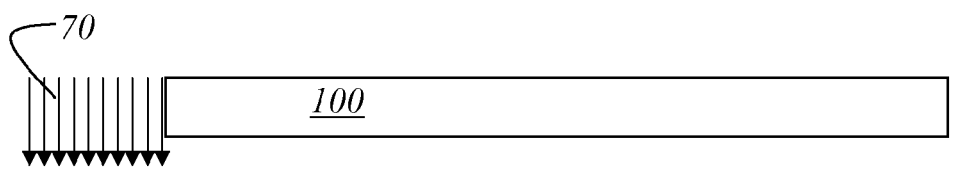
FIG. 7 shows an embodiment of the invention similar to the embodiment of FIG. 6, wherein the illumination apparatus is mounted laterally on the device.

FIG. 7 shows a further embodiment of the device, in which at least the illumination apparatus 41 of the second optical arrangement 40 is arranged laterally on the block 25. The light from the illumination apparatus 41 is guided with a deflecting mirror 63 under the block 25 in the second illumination branch 300. Otherwise, essentially all the components of the optical arrangement 40 are identical to those in FIGS. 5 and 6 and do not need further description here. In addition to the illumination apparatus 41, the beam attenuator 42 and the beam monitor 46 can be provided laterally on the block 25. The illumination apparatus 41, which is configured as a laser or as a conventional excimer lamp, causes heat generation. Through the arrangement of the illumination apparatus 41 laterally on the block 25, it is possible for an air stream 70 to be directed toward it to remove the dissipation heat of the illumination apparatus 41. It is obvious to a person skilled in the art that the air stream 70 should be guided in suitable manner so that the dissipation heat is removed optimally. Turbulence caused by the air stream must also be screened off so that no other optical components of the device are influenced, as this would falsify the measurement values obtained in a non-reproducible manner. Mounting the illumination apparatus 41 on the block 25 can be undertaken with suitable materials 80. Suitable materials 80 have the property that they possess low thermal conductivity. In order further to improve the removal of dissipation heat, the material 80 may additionally be provided with cooling ribs (not shown). These cooling ribs naturally lie in the air stream 70 then.

Figure 8:
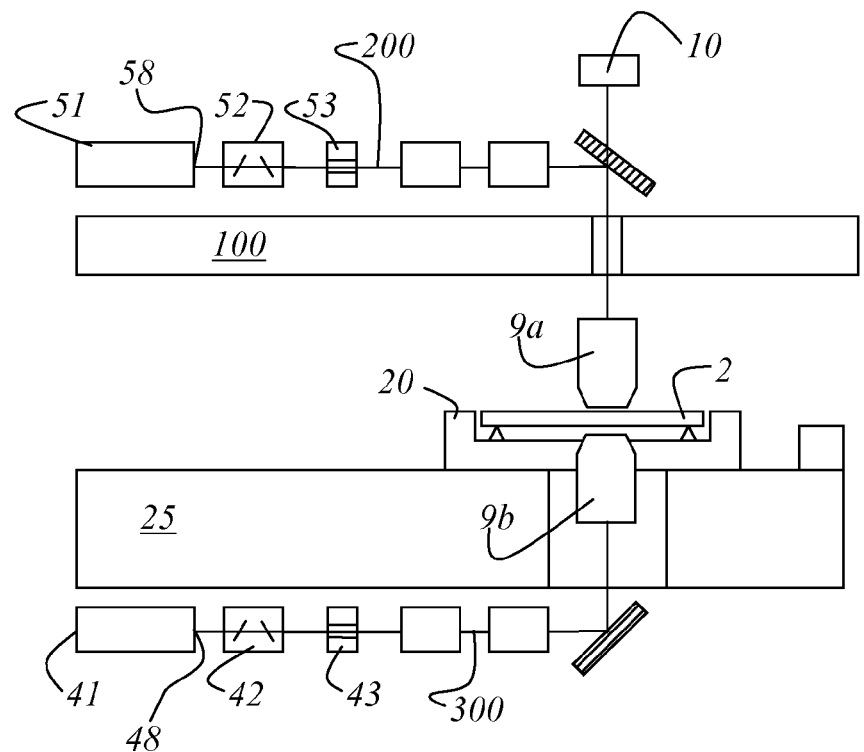
FIG. 8 shows an embodiment of the invention, wherein in the first illumination branch and in the second illumination branch, in each case, an illumination apparatus is provided.

FIG. 8 shows a further embodiment of the device, wherein in the first illumination branch 200 and in the second illumination branch 300, respectively, an illumination device 51 and 41 is provided. Thus a separate illumination apparatus 41 is provided for the reflected light illumination arrangement of the first optical element 9a (here the objective lens). Similarly, for the transmitted light illumination with the second optical element 9b (here the condenser) a separate illumination apparatus 51 is provided. In the first illumination branch 200, a shutter 53 is provided. A shutter 43 is also provided in the second illumination branch 300. The first shutter 53 and the second shutter 43 are needed in the respective illumination branch 200, 300 in order to switch between transmitted light and reflected light illumination. If reflected light illumination is used or needed, the shutter 43 in the second illumination branch 300 is closed and vice versa. Whilst the measuring table 20 is moving and no images are being recorded, both shutters 53 and 43 are closed to reduce or avoid exposure of the mask or the object 2 to the beam. For this purpose the shutter 53, 43 can be arranged at any position in the first illumination branch 200 or in the second illumination branch 300. The arrangement of the shutter 43, 53 directly at the first outlet 48 or 58 of the first illumination apparatus 51 or the second illumination apparatus 41 has proved particularly favourable. This arrangement of the shutters 53, 43 also reduces the illumination exposure of the various optical components in the first illumination branch 200 and/or in the second illumination branch 300, and this also increases their service life.

Figure 10:
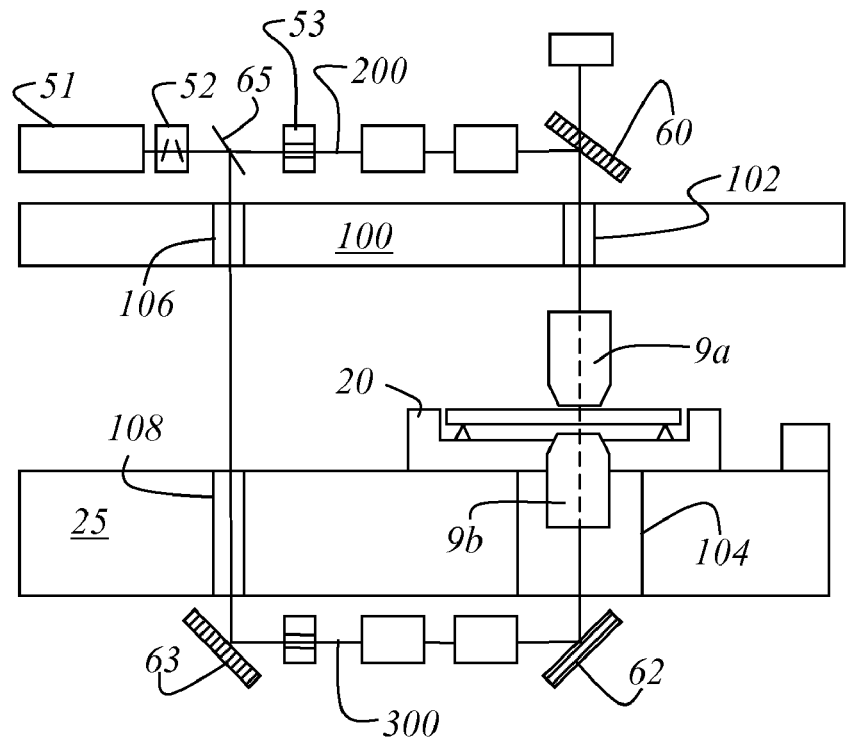
FIG. 10 shows an embodiment, wherein the illumination apparatus is provided over the optical system support, and the light from the illumination apparatus is fed into the first illumination branch and into the second illumination branch.

FIG. 10 shows an embodiment of the invention, in which the illumination apparatus 51 is mounted above the optical system support 100. The device is configured such that with the device both the reflected light illumination and the transmitted light illumination can be performed as desired. A divider 65 is arranged in the first illumination branch 200. The divider 65 directs part of the light emerging from the illumination apparatus 51 through the optical system support 100 and through the block 25 to a deflecting mirror 63, which directs the illumination light into the second illumination branch 300. In order to guide the illumination light through for the second illumination branch 200 appropriate recesses 106 and perforations 108 are provided in the optical system support 100 and the block 25. As previously mentioned several times in the description, the light from the second illumination branch 300 is directed toward the second optical element 9b (condenser). The light in the first illumination branch 200 is directed toward the first optical element 9a (objective lens).

Figure 11:
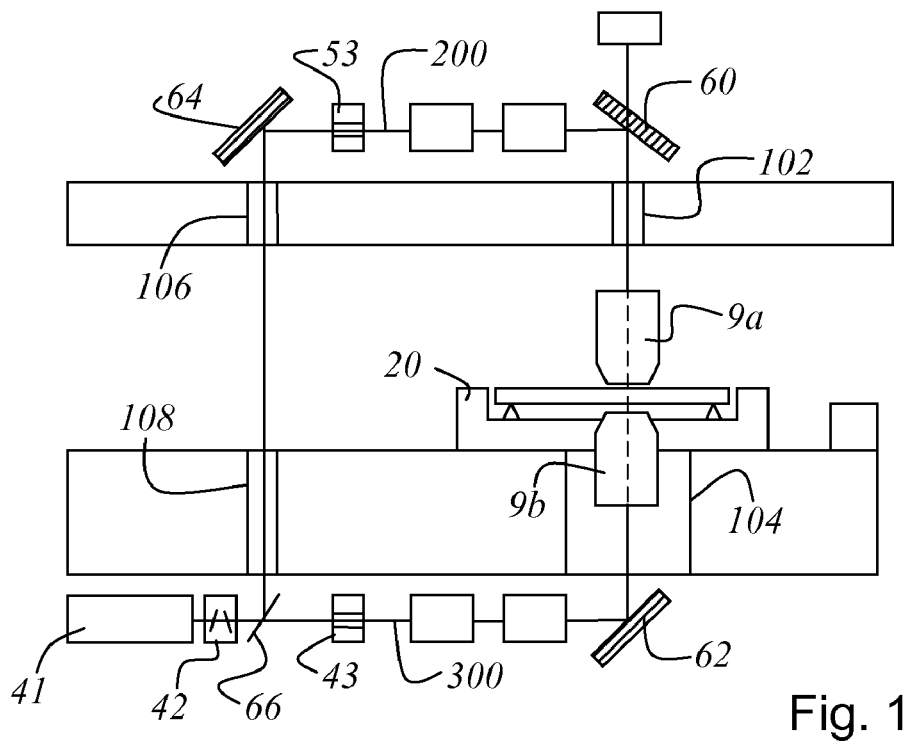
FIG. 11 shows a further embodiment of the invention, which differs from the embodiment of FIG. 10 in that the illumination apparatus is arranged under the block.

The embodiment shown in FIG. 11 differs from that in FIG. 10 in that the illumination apparatus 41 is arranged under the block 25. The light emitted from the illumination apparatus 41 into the second illumination branch 300 initially meets a divider 66. From the divider 66, part of the illumination light passes into the second illumination branch 200. The other part of the illumination light is deflected by the divider 66 and passes through the perforations 108 and 106 in the block 25 and the optical system support 100 to a deflecting mirror 64 in the first illumination branch 200. The light can thus be directed to the first optical element 9a or the second optical element 9b as desired. As mentioned above, in the first illumination branch 200, a shutter 53 is provided. Also in the second illumination branch 300, a shutter 43 is provided. Depending on the choice of whether transmitted light illumination or reflected light illumination is desired, the shutters 43 or 53 can be actuated accordingly so that light is available in the first illumination branch 200 or in the second illumination branch 300.

As shown in FIGS. 10 and 11, arranged downstream of the first illumination apparatus 51 is a beam attenuator 52. Likewise, arranged downstream of the second illumination apparatus 41 is a beam attenuator 42. The beam attenuator 42, 52 serves to adapt the intensity to the reflection of the light source in order to avoid overdriving the camera 10 in the imaging channel. In principle, the beam attenuator 52 or 42 can be arranged anywhere in the illumination ray path 200 or 300. A sole condition for the arrangement of the beam attenuator 52 or 42 is that in the first illumination branch 200 or in the second illumination branch 300, the beam geometry must be suitable for the beam attenuator 52 or 42 to be positioned at this site. In most beam attenuators, the attenuation depends on the angle of incidence. Consequently, the beam attenuator 52 or 42 is arranged at sites of small beam divergence. Particularly advantageous is an arrangement of the beam attenuator 52 or 42 directly behind the shutter 53 or 43. This is advantageous since the optical components present in the rest of the first illumination branch 200 or second illumination branch 300 are exposed to a lower beam intensity.

Figure 12:
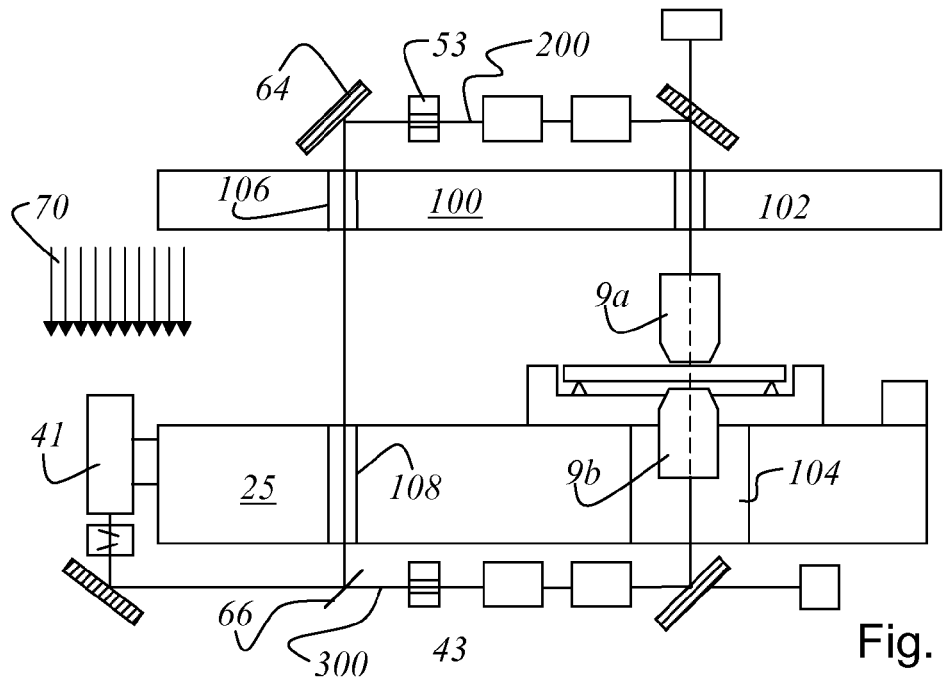
FIG. 12 shows an embodiment similar to the embodiment of FIG. 11, wherein the illumination apparatus is mounted laterally on the device.

FIG. 12 shows an embodiment, in which the illumination apparatus 41 is arranged laterally on the block 25. This arrangement of the illumination apparatus 41 is essentially identical to the arrangement of the illumination apparatus 41 in FIG. 7. The light emerging from the illumination apparatus 41 is again fed into the first illumination branch 200 and the second illumination branch 300. For this purpose, again a divider 66 is provided which directs the light beam emerging from the illumination apparatus 41 through the recess 106 in the optical system support and the perforation 108 in the block 25 to a deflecting mirror 64, which then feeds the light into the first illumination path 200.

Figure 13:
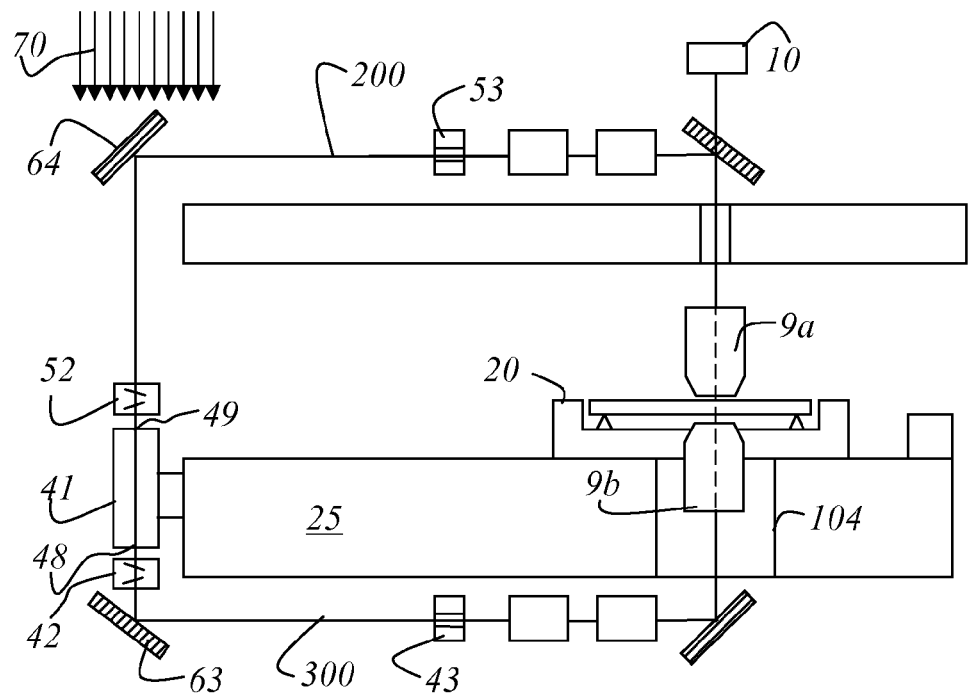
FIG. 13 shows a further embodiment, wherein the illumination apparatus is also mounted laterally on the device, but the light from the illumination apparatus cannot be conducted through the optical system support or the block into the first illumination branch or the second illumination branch.

FIG. 13 also shows the illumination apparatus 41 arranged laterally on the block 25. The difference from the arrangement shown in FIG. 12 is that the illumination apparatus 41 has a first outlet 48 and a second outlet 49. Arranged downstream of the first outlet 48 of the illumination apparatus 41 is a beam attenuator 42. Arranged downstream of the second outlet 49 of the illumination apparatus 41 is a beam attenuator 52. The light from the illumination apparatus 41 coming from the first outlet 48 and the second outlet 49 is guided via a deflecting mirror 63 or 64 into the first illumination branch 200 or into the second illumination branch 300. Provided in both the first illumination branch 200 and the second illumination branch 300 is a shutter 43 or 53. With the aid of the shutter 53, 43, the illumination can be controlled such that, according to wish, reflected light or transmitted light illumination is provided.

Figure 14:
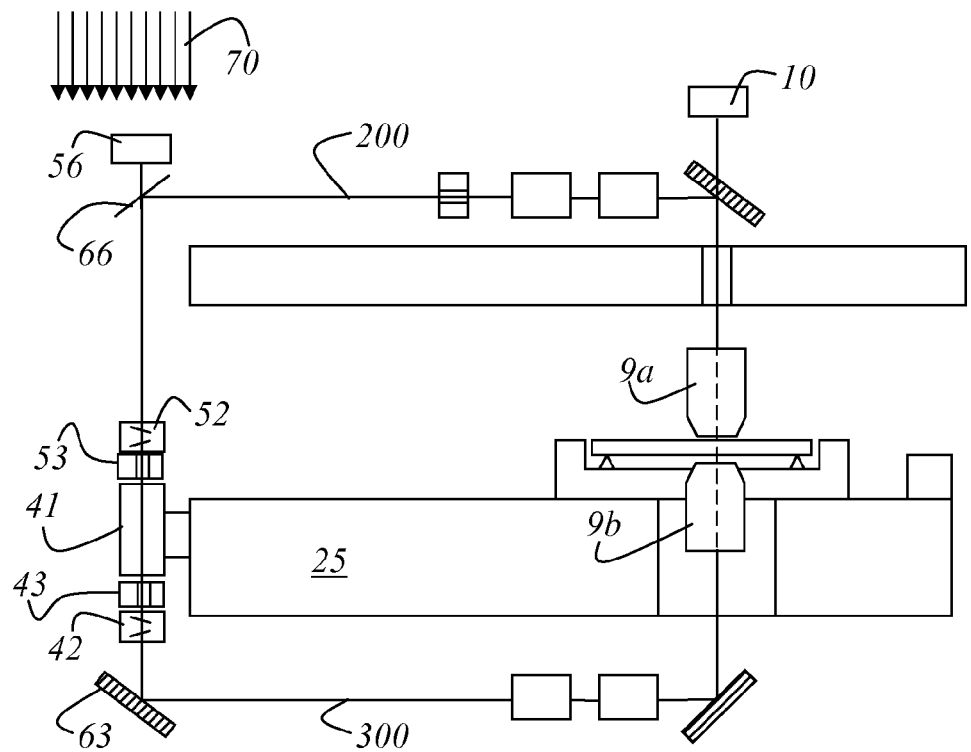
FIG. 14 shows an embodiment of the invention which is similar to the embodiment of FIG. 13, wherein the two outputs of the illumination apparatus each have a shutter and a beam attenuator assigned to them.

FIG. 14 shows an embodiment of the invention, in which the illumination apparatus 41 is also arranged laterally on the block 25. Arranged downstream of the first outlet of the illumination apparatus 41 is a shutter 43. Furthermore, a beam attenuator 42 is arranged downstream of the shutter 43. Also arranged downstream of the second outlet 49 of the illumination apparatus 41 is a shutter 53. Arranged downstream of the shutter 53 is also a beam attenuator 52. The illumination light for the first illumination branch 200 and the illumination light for the second illumination branch 300 is fed laterally past the optical system support 100 and laterally past the block 25 in this embodiment. The light from the illumination apparatus 41 is deflected by means of a deflecting mirror 63 into the second illumination branch 300. The light from the illumination apparatus 41 which emerges from the second outlet 49 is deflected by means of a divider 66 into the first illumination branch 200. Part of the light passes from the divider 66 to a beam monitor 56 with which, as mentioned several times above, the intensity of the illumination apparatus 41 can be monitored.

Figure 15:
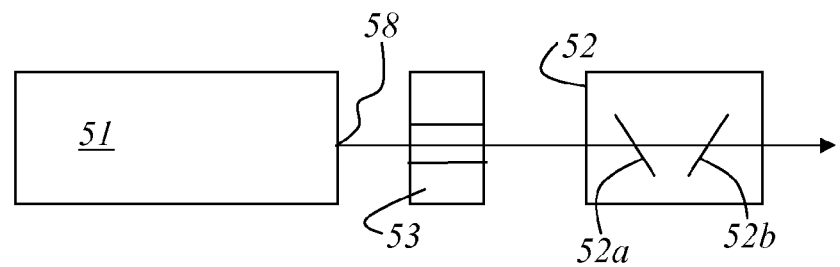
FIG. 15 shows an embodiment, wherein the illumination apparatus is an excimer laser.

FIG. 15 shows an embodiment of the illumination apparatus 51. Although in the description below in relation to FIGS. 15 and 16, only the reference sign 51 is used for the illumination apparatus, it is obvious to a person skilled in the art that the same design conditions apply also for the illumination apparatus with the reference sign 41. In FIG. 15, arranged downstream of the illumination apparatus 51 is a shutter 53. In the embodiment shown here, the shutter 53 is arranged directly downstream of the first outlet 58 of the illumination apparatus 51. In the following description, the illumination apparatus 51 is a laser. A beam attenuator 52 is arranged downstream of the shutter 53. The beam attenuator 52 has a first inclined plate 52a and a second inclined plate 52b. The second inclined plate 52b has the same quantitative, although opposite, angular position as the first inclined plate 52a of the beam attenuator 52. The inclined plates 52a and 52b can be provided, for example, with absorption filters in the known embodiments. A particularly advantageous embodiment is when the inclination angles of the individual plates 52a and 52b can be adjusted. Depending on the chosen angular position, a predetermined percentage of the light can be reflected out of the beam path. As already mentioned above, the beam offset caused by the angled position of a plate can be compensated for by a second angled plate 52b. If the angular position of the plates 52a and 52b is driven by motor, the intensity level of the device can be set fully automatically.

Figure 16:
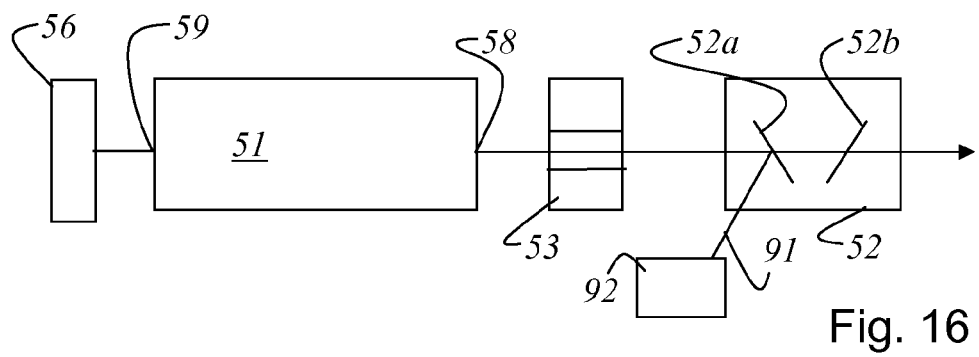
FIG. 16 shows an embodiment of the illumination apparatus which is also configured as an excimer laser, wherein the excimer laser has a first and a second output.

FIG. 16 illustrates the same device as in FIG. 15 except that a beam monitor 56 is assigned to the second outlet 59 of the illumination apparatus 51. The portion of the light 91 reflected out by the first inclined plate 52a passes to a beam trap 92 and is absorbed there. This also generates dissipation heat which must not come near to the substrate or the mask. It is therefore advantageous if the beam attenuator 52 is arranged geometrically as far as possible from the mask and the substrate. As mentioned several times in the description of the device, the illumination apparatus 51 or 41 is arranged in an air stream so that the dissipation heat can be carried away. Since the beam attenuator 52 is also situated immediately following the first outlet 58 or the second outlet 59 of the illumination apparatus 51, the beam attenuator is thus also arranged in the air stream, so that here too, sufficient cooling and the removal of dissipation heat can be carried out.

Figure 17:
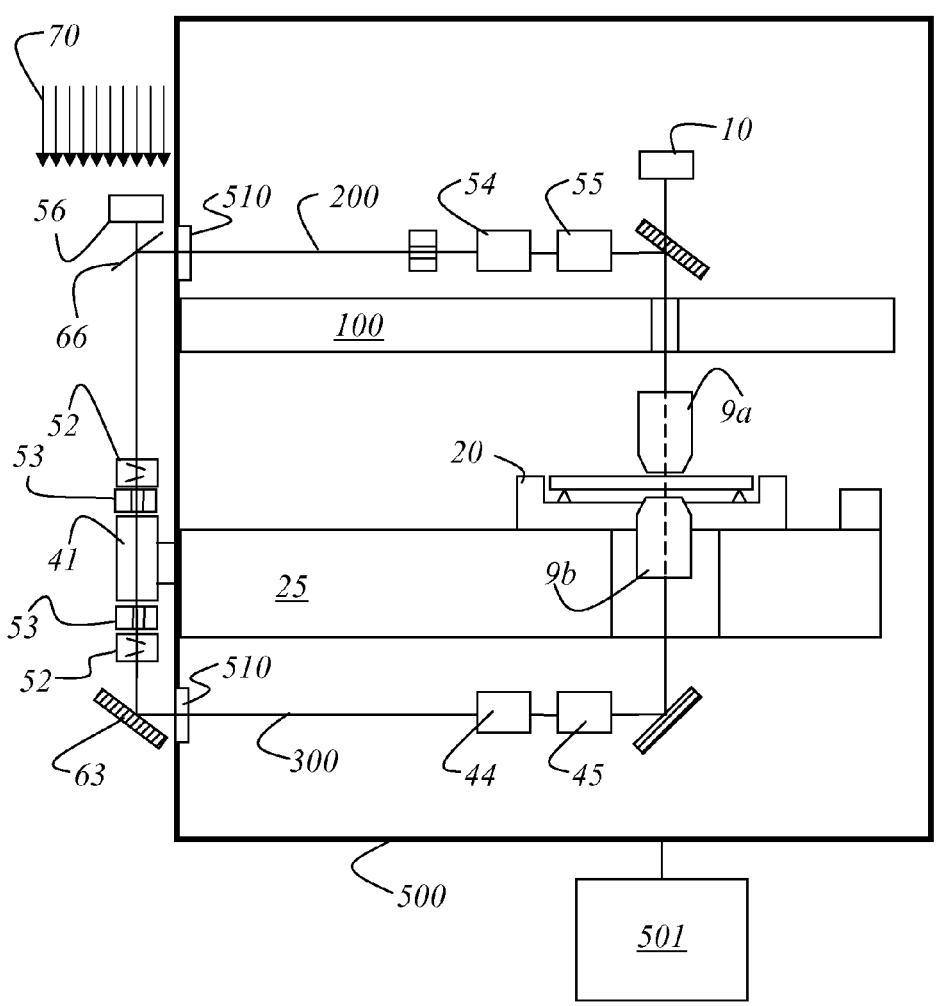
FIG. 17 shows an embodiment of the invention, wherein the device is arranged largely within a climate chamber.

FIG. 17 shows an embodiment of the device wherein the device 1 is arranged in a housing which is configured as a climate chamber 500. The climate chamber 500 is connected to a control system 501 so that the desired pressure, humidity and protective gas environment can be set and monitored. It might also be useful to conduct the light reflected out of the beam attenuator (see FIG. 16) out of the climate chamber. The beam trap 91 can then be arranged outside the climate chamber. The dissipation heat therefore no longer comes close to the substrate or the object 2. It is also useful to arrange the illumination apparatus 41 outside the climate chamber 500. The climate chamber 500 has suitable windows 510 which are transparent for the wavelength of the light from the illumination apparatus 41, so that the light from the illumination apparatus 41 passes into the interior of the climate chamber 500. In the embodiment shown here, the illumination apparatus 41 has a first outlet and a second outlet. A shutter 53 and a beam attenuator 52 can be arranged at each of the two outlets. Part of the light from the illumination apparatus 41 passes from the divider 66 to a beam monitor 56, by means of which, as mentioned several times above, the intensity of the illumination apparatus 41 can be monitored. From the divider 66, the light from the illumination apparatus 41 also passes into the first illumination branch 200. The light from the illumination apparatus 41 can be deflected by means of a deflecting mirror 63 into the second illumination branch 300. It is obvious to a person skilled in the art that the illustration shown in FIG. 17 is not a limitation of the invention. What is important here is only that as many of the components of the device as possible which produce dissipation heat should be arranged outside the housing. An air stream 70 for carrying away the dissipation heat from the illumination apparatus 41 and other components which produce dissipation heat is directed towards these. It is obvious to a person skilled in the art that the air stream 70 should be guided in suitable manner so that it produces optimum removal of the dissipation heat.

Figure 18:
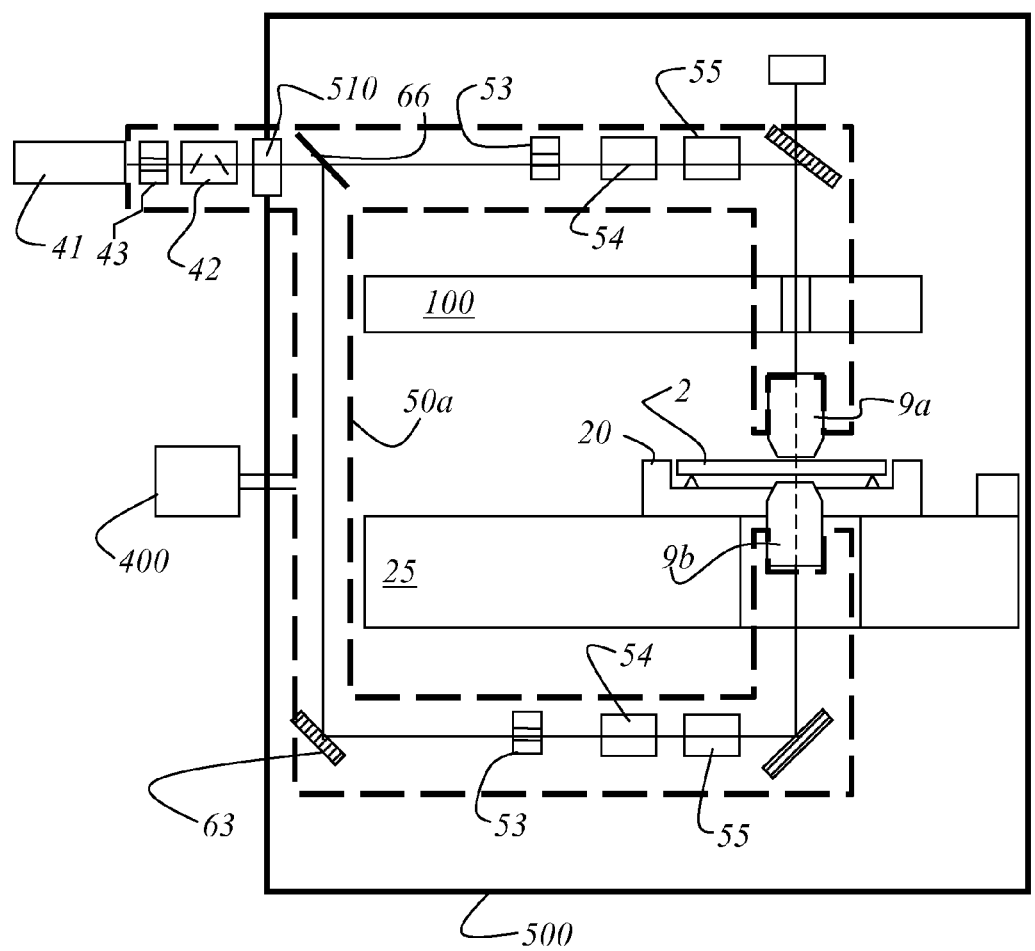
FIG. 18 shows an embodiment, wherein all the optical parts of the first illumination branch or of the second illumination branch are arranged within an encapsulation.

FIG. 18 shows an embodiment of the device, in which the overall ray path of the light from the illumination apparatus inside and outside the climate chamber 500 is additionally provided with an encapsulation 50a. The encapsulation 50a may be filled with a suitable protective gas from a reservoir 400. Nitrogen has proved to be a particularly preferable protective gas. The use of protective gas is advantageous if for the illumination of the object 2 a wavelength is chosen that is smaller than 220 nm. At this wavelength, the level of absorption in the normal ambient air is too high. The cause of this is mainly atmospheric moisture. In order to keep losses small, flushing out with protective gas is therefore necessary. Many dry, inert gases are suitable as protective gases. As previously mentioned, the use of nitrogen is particularly advantageous since it is inexpensive and safe to use. In addition, hydrocarbons are always present in the normal ambient air. Light of these short wavelengths breaks the hydrocarbons down and the resulting decomposition products become deposited as a film on the individual optical elements of the first optical branch and of the second optical branch. As a result of the deposition of the decomposition products on the optical components, the transmission properties of these optical components become degraded. By means of the protective gas flushing, therefore, this contamination by hydrocarbons on the surfaces is avoided and the service life of the optical components is extended. In the embodiment shown here, the illumination apparatus 41, a shutter 43 and a beam attenuator 42 are provided outside the climate chamber 500. The shutter 43 is useful since with it the light from the illumination apparatus 41 can be kept away from the remainder of the device when no measurement is being carried out with the device. All the optical components of the device are thereby protected from unnecessary exposure to the beam, thereby extending their service life. The light from the illumination apparatus 41 passes via a window 510 into the portion of the encapsulation 50a, which is situated in the interior of the climate chamber 500. Part of the light from the illumination apparatus 41 is guided via a divider 66 parallel to the optical system support 100. Although in the representation shown here, the light from the illumination apparatus 41 is guided above the optical system support 100, this should not be regarded as a limitation of the invention. From the divider 66, part of the light passes to a deflecting mirror which deflects the light such that it is guided parallel to, and under, the block 25. Provided in the light beam which passes parallel to the optical system support 100 and parallel to, and under, the block 25, in each case, are a shutter 53, an apparatus for speckle reduction 54 and a homogenizer 55.

As described above, the optical arrangement 40 or 50 can also comprise a homogenizer 55 or 45. The homogenizer 55 or 45 serves to illuminate the object field and the pupil evenly. The even object illumination ensures that the measuring result does not depend on the location of the structure 3 being measured within the object field. Uneven pupil illumination leads to systematic measuring errors, which depend on the actual size of the structure 3. To avoid this, in critical applications, as in the measurement of the positions of structures 3 on an object 2, the pupil is homogenized.

If a laser is used as the illumination apparatus 51 or 41, the level of coherence of this light source is too high and speckles occur. This leads to a flecked and very noisy image and is not suitable to be used for the measurement of positions of structures 3 on an object 2. During evaluation, speckles of this type lead to errors in the positional determination. In order to avoid this, it is necessary to use an apparatus for speckle reduction 54 or 44. These apparatuses are essentially based thereon that averaging is carried out over a plurality of images, thereby ensuring that the speckles are not constant over time. This can be done by one of the following methods.

If a pulsed light source is used, then the speckle pattern changes between two pulses. It is possible therefore to average over a plurality of individual images. With continuous light sources, rotating ground glass disks suggest themselves. The averaging then takes place within the exposure time. It is also conceivable to use a glass fibre with mode mixing properties. Averaging can then be achieved using these glass fibres.

The illumination apparatus 51 or 41 (except the excimer lamp) are pulsed light sources. With these, inevitably variations in the intensity occur from pulse to pulse. In order to detect large anomalies or to be able to correct the actual pulse energy, it must be recorded together with the measurements. Advantageous for this is the arrangement of a beam monitor 56 directly behind the beam attenuator 52. The measuring result from the beam monitor 56 can thus be used for automatic setting of the beam attenuator 52.

Also advantageous is the detection of the intensity before the first optical element 9a (objective lens in the reflected light case) or before the second optical element 9b (condenser in the transmitted light case), since at this point, losses in the optical path to this point are detected. With progressive degradation of the optical components, the results from intensity measurements made directly in the vicinity of the illumination apparatus 41 or directly after the beam attenuator 42 no longer match the intensity that finally reaches the object 2 or the mask. This would also lead to false results in the measurement of the position of the structure. The use of the measured intensity to correct the results when measuring the position of structures 3 on an object 2 and for determining the degradation of the optical system is therefore advantageous.

While this invention has been particularly shown and described with references to preferred embodiments thereof, it will be understood by those skilled in the art that various changes in form and details may be made therein without departing from the scope of the invention encompassed by the appended claims.

What the claimed is:

1. A device for determining the position of a structure on an object in relation to a coordinate system, the device comprising
    a measuring table carrying the object,
        wherein the measuring table is movable in a plane,
    a block defining the plane,
    at least one laser interferometer system for determining a positional change of the measuring table in the plane,
    at least one optical arrangement for transmitted or reflected light illumination of the object,
        wherein each optical arrangement defines an illumination branch,
    an optical system support,
    an illumination apparatus for reflected or transmitted light illumination, and
    at least one optical element,
    wherein at least one part of the at least one optical element extends into a space formed between the block and the optical system support,
    wherein the block or the optical system support spatially separates the illumination apparatus from the plane.

2. The device according to claim 1, wherein the illumination apparatus further comprises as a light source
    at least one excimer laser or at least one frequency-multiplied solid-state laser or a gas laser, or
    at least one excimer lamp,
    wherein a single light source or separate light sources are provided for the reflected light illumination or for the transmitted light illumination.

3. The device according to claim 2, wherein the excimer laser is equipped with a device for limiting the bandwidth.

4. The device according to claim 1, wherein at least one optical element is a high resolution microscope lens, which forms on a detector an image of a structure on the surface of the object under reflected light or transmitted light in the spectral region of less than 400 nm.

5. The device according to claim 1, wherein the illumination apparatus is mounted only in the reflected light arrangement and that the first optical element is mounted opposite a surface of the object carrying the structures, in the reflected light arrangement, and is designed as an objective lens or the illumination apparatus is mounted only in the transmitted light arrangement and that the second optical element is mounted opposite a surface of the object not carrying the structures, in the transmitted light arrangement, and is designed as a condenser.

6. The device according to claim 1, wherein the optical arrangement in each illumination branch for the reflected light illumination or the transmitted light illumination comprises an apparatus for speckle reduction or at least one shutter or at least one homogeniser or at least one beam attenuator.

7. The device according to claim 1, wherein a beam monitor is assigned to the illumination apparatus.

8. The device according to claim 1, wherein one illumination apparatus emits a light beam, which runs both along a first illumination branch parallel to the optical system support to the first optical element and also along a second illumination branch under the block to the second optical element.

9. The device according to claim 8, wherein the illumination apparatus emits light parallel to the optical system support and that a divider is provided, which directs part of the light from the illumination apparatus through the block into the second illumination branch.

10. The device according to claim 9, wherein an air stream can be directed at least onto the illumination apparatus.

11. The device according to claim 1, wherein the one illumination apparatus is arranged laterally on the device and has a first outlet and a second outlet for illumination light, wherein the light beam runs from the first outlet along a first illumination branch, parallel to the optical system support, to the first optical element and the light beam from the second outlet runs along a second illumination branch under the block to the second optical element.

12. The device according to claim 1, wherein the illumination apparatus for the reflected light illumination or the transmitted light illumination contains a homogeniser for the field illumination or a homogeniser for the pupil illumination of the first optical element and/or of the second optical element.

13. The device according to claim 12, wherein the homogenising is carried out by means of microlenses, which are configured as a hexagonal array or as an orthogonal array or as cylindrical lenses, wherein two crossed cylindrical lens arrays are provided or.

14. The device according to claim 13, wherein the homogenising is carried out with the aid of a diffractive element or with the aid of a light mixing rod.

15. The device according to claim 1, wherein an apparatus for speckle reduction is provided in the first illumination branch or in the second illumination branch.

16. The device according to claim 15, wherein the at least one apparatus for speckle reduction is configured to be diffractive or is a rotating diffusion screen or is a mode mixing fibre.

17. The device according to claim 1, wherein the illumination apparatus is fastened to the device with a material of low thermal conductivity, in order to reduce the transfer of heat to the optical system support and/or the block.

18. The device according to claim 1, wherein a climate chamber is provided, wherein the at least one illumination apparatus is arranged outside the climate chamber.

19. The device according to claim 18, wherein a protective gas environment is provided in the climate chamber.

20. The device according to claim 1, wherein an encapsulation is provided for the optical arrangement for transmitted light illumination or reflected light illumination, and that the encapsulation can be filled with protective gas.

21. The device according to claim 20, wherein the protective gas in the encapsulation is nitrogen.

22. The device according to claim 20, wherein an excess pressure relative to the ambient pressure is provided in the encapsulation.

* * * * *